(12) United States Patent
Hosoda et al.

(10) Patent No.: US 11,910,610 B2
(45) Date of Patent: Feb. 20, 2024

(54) SEMICONDUCTOR DEVICE, MEMORY DEVICE, AND METHOD FOR FORMING TRANSISTOR ON SUBSTRATE

(71) Applicant: KIOXIA CORPORATION, Tokyo (JP)

(72) Inventors: Tatsuya Hosoda, Yokkaichi Mie (JP); Yasuhisa Naruta, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 254 days.

(21) Appl. No.: 17/191,249

(22) Filed: Mar. 3, 2021

(65) Prior Publication Data

US 2022/0093628 A1 Mar. 24, 2022

(30) Foreign Application Priority Data

Sep. 18, 2020 (JP) ................................. 2020-157386

(51) Int. Cl.
| | |
|---|---|
| *H01L 29/49* | (2006.01) |
| *H10B 43/40* | (2023.01) |
| *H01L 21/28* | (2006.01) |
| *H10B 41/27* | (2023.01) |
| *H10B 41/41* | (2023.01) |
| *H10B 43/27* | (2023.01) |

(52) U.S. Cl.
CPC ....... *H10B 43/40* (2023.02); *H01L 21/28035* (2013.01); *H01L 29/4925* (2013.01); *H10B 41/27* (2023.02); *H10B 41/41* (2023.02); *H10B 43/27* (2023.02)

(58) Field of Classification Search
CPC .......... H01L 29/4925; H01L 21/28035; H10B 41/41; H10B 43/27; H10B 41/27; H10B 43/40
See application file for complete search history.

(56) References Cited

U.S. PATENT DOCUMENTS

| | | | |
|---|---|---|---|
| 7,253,465 B2 | 8/2007 | Yamamoto et al. | |
| 7,560,327 B2 | 7/2009 | Kim et al. | |
| 10,256,099 B1* | 4/2019 | Akaiwa | ............... H01L 29/7851 |
| 10,355,017 B1* | 7/2019 | Nakatsuji | ............... H10B 43/50 |
| 2008/0258197 A1* | 10/2008 | Coolbaugh | ............. H01L 29/94 |
| | | | 438/386 |
| 2010/0285642 A1 | 11/2010 | Rouh et al. | |

(Continued)

FOREIGN PATENT DOCUMENTS

TW 202011587 A 3/2020

*Primary Examiner* — Jay C Chang
*Assistant Examiner* — Siangluai Mang
(74) *Attorney, Agent, or Firm* — Kim & Stewart LLP

(57) ABSTRACT

A semiconductor device includes a substrate, a gate insulating layer on the substrate, and a stacked semiconductor layer. The stacked semiconductor layer includes a first layer formed on the gate insulating layer and including a phosphorus-doped polycrystalline semiconductor, a second layer formed on the first layer and including a carbon-doped polycrystalline semiconductor, and a third layer formed on the second layer and including a phosphorus-doped or undoped polycrystalline semiconductor. The semiconductor device further includes a metal layer on or above the stacked semiconductor layer. The third layer includes less phosphorus than the first layer or does not include phosphorus.

20 Claims, 10 Drawing Sheets

(56) References Cited

U.S. PATENT DOCUMENTS

| | | | |
|---|---|---|---|
| 2013/0187153 A1* | 7/2013 | Yamazaki | H01L 29/66969 257/43 |
| 2013/0187161 A1* | 7/2013 | Yamazaki | H01L 29/78609 438/158 |
| 2014/0264537 A1* | 9/2014 | Sakamoto | H10B 41/42 257/316 |
| 2020/0083249 A1* | 3/2020 | Matsuura | H10B 43/27 |
| 2020/0328154 A1* | 10/2020 | Jiang | H01L 21/76816 |
| 2021/0167083 A1* | 6/2021 | Kim | H01L 23/5226 |

* cited by examiner

SEMICONDUCTOR DEVICE, MEMORY DEVICE, AND METHOD FOR FORMING TRANSISTOR ON SUBSTRATE

CROSS-REFERENCE TO RELATED APPLICATION(S)

This application is based upon and claims the benefit of priority from Japanese Patent Application No. 2020-157386, filed Sep. 18, 2020, the entire contents of which are incorporated herein by reference.

FIELD

Embodiments described herein relate generally to a semiconductor device, a memory device, and a method for forming a transistor on a substrate.

BACKGROUND

In order to more highly integrate semiconductor memory devices, a three-dimensional stacked non-volatile memory device has been proposed. The three-dimensional stacked non-volatile memory device has, for example, a structure in which a memory cell array and a peripheral circuit for controlling the memory cells are stacked. The peripheral circuit is formed of complementary metal oxide semiconductor (CMOS) transistors or the like. The performance characteristics of CMOS transistors may deteriorate during the manufacturing process thereof, and the like.

DETAILED DESCRIPTION

Figure 1:
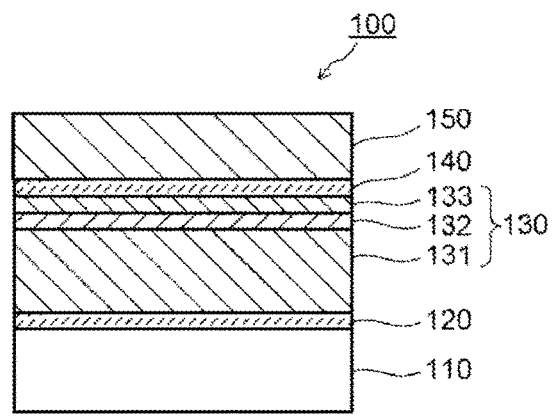
FIG. 1 is a cross-sectional view showing a gate electrode in a semiconductor device according to an embodiment.

Embodiments provide a semiconductor device and a semiconductor storage device with improved characteristics.

In general, according to one embodiment, a semiconductor device includes a substrate, a gate insulating layer on the substrate, and a stacked semiconductor layer. The stacked semiconductor layer includes a first layer formed on the gate insulating layer and including a phosphorus-doped polycrystalline semiconductor, a second layer formed on the first layer and including a carbon-doped polycrystalline semiconductor, and a third layer formed on the second layer and including a phosphorus-doped or undoped polycrystalline semiconductor. The semiconductor device further includes a metal layer on or above the stacked semiconductor layer. The third layer includes less phosphorus than the first layer or does not include phosphorus.

Hereinafter, a semiconductor device and a semiconductor storage device according to certain example embodiments will be described with reference to drawings. In each example embodiment, the components or aspects which are substantially the same between different embodiments are denoted with the same reference numerals, and description of such repeated components or aspects may be omitted in some instances. The accompanying drawings are schematic, and, as such, any depicted relationships between dimensions of elements (e.g., a thickness, a planar dimension, a ratio of layers thickness, or the like) may differ from an actual one.

First Embodiment/Gate Electrode

FIG. 1 is a cross-sectional view showing a gate electrode 100 in a semiconductor device according to an embodiment. The gate electrode 100 shown in FIG. 1 is provided on a gate insulation layer 120 formed on one surface of a semiconductor substrate 110. A silicon substrate, for example, is used as the semiconductor substrate 110. For example, silicon oxide (SiO) is used for the gate insulation layer 120. The gate electrode 100 includes a stacked semiconductor layer 130 having a three-layer structure, a metal layer 150, and a TSI (Through Silicon oxide Insertion) layer 140 if necessary.

The stacked semiconductor layer 130 having the three-layer structure is formed on the gate insulation layer 120. The stacked semiconductor layer 130 includes, in an order from a side closer to the gate insulation layer 120, a first layer 131 including a phosphorus (P)-doped polycrystalline semiconductor, a second layer 132 including a carbon (C)-doped polycrystalline semiconductor, and a third layer 133 including a P-doped or undoped polycrystalline semiconductor. For example, polysilicon is used as the polycrystalline semiconductors in the first layer 131, the second layer 132, and the third layer 133 of the stacked semiconductor layer 130.

The carbon doped in the second layer 132 has an effect of capturing P and preventing mutual diffusion. However, as shown in a manufacturing process (FIG. 2) which will be described later, an oxide film 160 for reducing an etching residue is formed, but when the oxide film 160 is formed directly on the second layer 132, the oxide film 160 becomes difficult to peel off. Therefore, the third layer 133 is formed on the second layer so that the oxide film 160 easily peel off together with a part of the third layer 133.

The third layer 133 prevents an increase in resistance at an interface between the stacked semiconductor layer 130 and the metal layer 150 which will be described later. However, when a P-doped amount in the third layer 133 is large, accelerated oxidation of the TSI layer 140 as an oxide layer which will be described later is promoted. Therefore, the P-doped amount of the third layer 133 is set to be smaller than a P-doped amount of the first layer 131. That is, a phosphorus content of the third layer 133 is less than that of the first layer 131.

The TSI layer 140 is formed on the third layer 133 of the stacked semiconductor layer 130, if necessary. The TSI layer 140 prevents impurities from diffusing into the metal layer 150, which will be described later. For example, silicon oxide (SiO) is used for the TSI layer 140. However, depending on a material of the metal layer 150, as shown in FIG.

2, the TSI layer 140 may be omitted, and the metal layer 150 may be formed directly on the stacked semiconductor layer 130.

The metal layer 150 is formed on the TSI layer 140. As the metal layer 150, for example, tungsten silicide (WSi) and titanium nitride (TiN), or titanium (Ti), titanium nitride (TiN), and tungsten (W), are stacked in this order from a side closer to the TSI layer 140.

When the metal layer 150 is formed of Wsi and TiN, impurities may diffuse into the WSi at the interface. Therefore, it is preferable to provide the TSI layer 140. However, when the metal layer 150 is formed of Ti, TiN, and W, the TSI layer 140 is not always necessary since the W does not exist at the interface. The gate electrode 100 shown in FIG. 2 includes, for example, a Ti/TiN/W stacked film as the metal layer 150, and formation of the TSI layer 140 is omitted.

Figure 3A:
FIG. 3A to FIG. 3F are diagrams showing a manufacturing process of a gate electrode according to an embodiment.
Figure 3B:
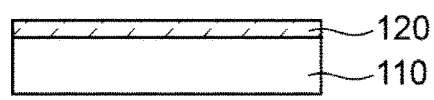

The gate electrode 100 described above is manufactured, for example, as follows. A manufacturing process of the gate electrode 100 is described with reference to FIGS. 3A to 3F. The semiconductor substrate 110 as shown in FIG. 3A is prepared. As shown in FIG. 3B, the gate insulation layer 120 is formed on one surface of the semiconductor substrate 110.

Figure 3C:
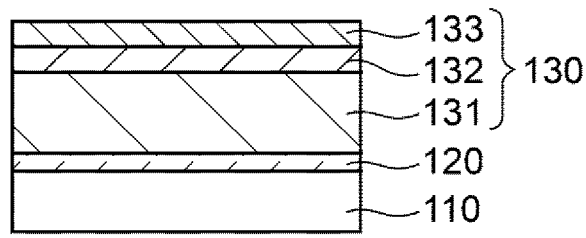
Figure 3D:
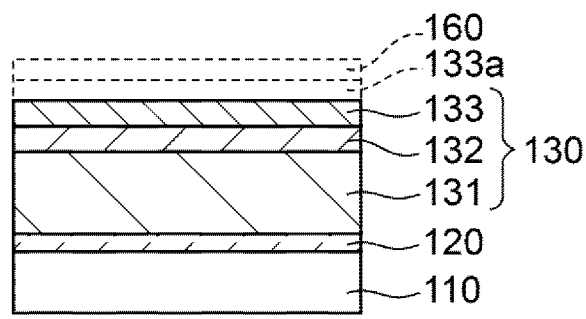

Next, as shown in FIG. 3C, the first layer 131, the second layer 132, and the third layer 133 are formed on the gate insulation layer 120 in this order to form the stacked semiconductor layer 130. As shown in FIG. 3D, the oxide film 160 is formed on the third layer 133. For example, silicon oxide (SiO) is used for the oxide film 160.

Figure 3E:
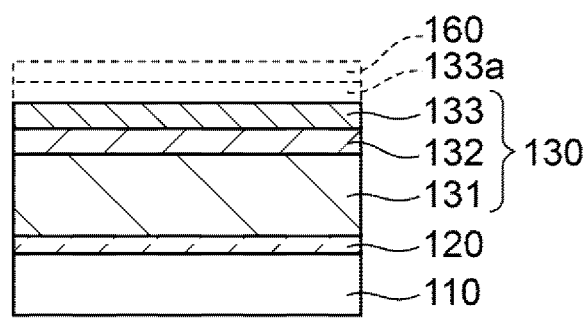

Then, after the oxide film 160 is formed, as shown in FIG. 3E, the oxide film 160 and an upper layer portion 133a of the third layer 133 are removed. As a removing method, mechanical etching such as chemical mechanical polishing (CMP) or chemical etching is used. As the chemical etching, for example, chemical dry etching (CDE), reactive ion etching (RIE), or wet etching is used. Further, among these removing methods, a plurality of removing methods may be used in combination.

Figure 2:
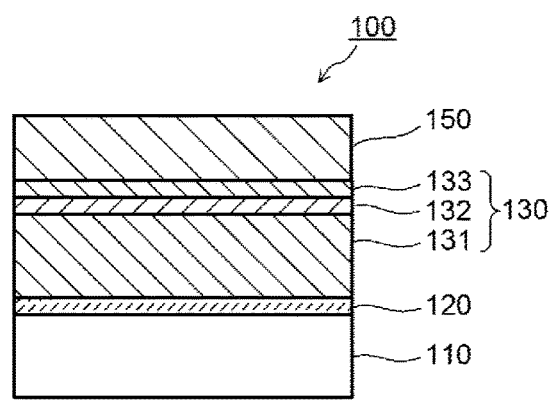
FIG. 2 is a cross-sectional view showing a semiconductor device according to an embodiment.
Figure 3F:
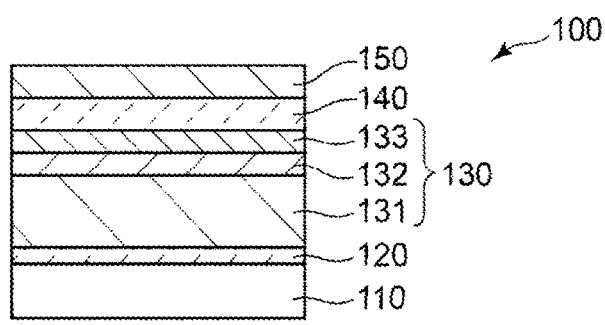

Next, as shown in FIG. 3F, the TSI layer 140 is formed on the third layer 133, and the metal layer 150 is formed on the TSI layer 140 to obtain the gate electrode 100 shown in FIG. 1. The gate electrode 100 shown in FIG. 2 is obtained by forming the metal layer 150 directly on the third layer 133.

Second Embodiment/Semiconductor Device

Figure 4:
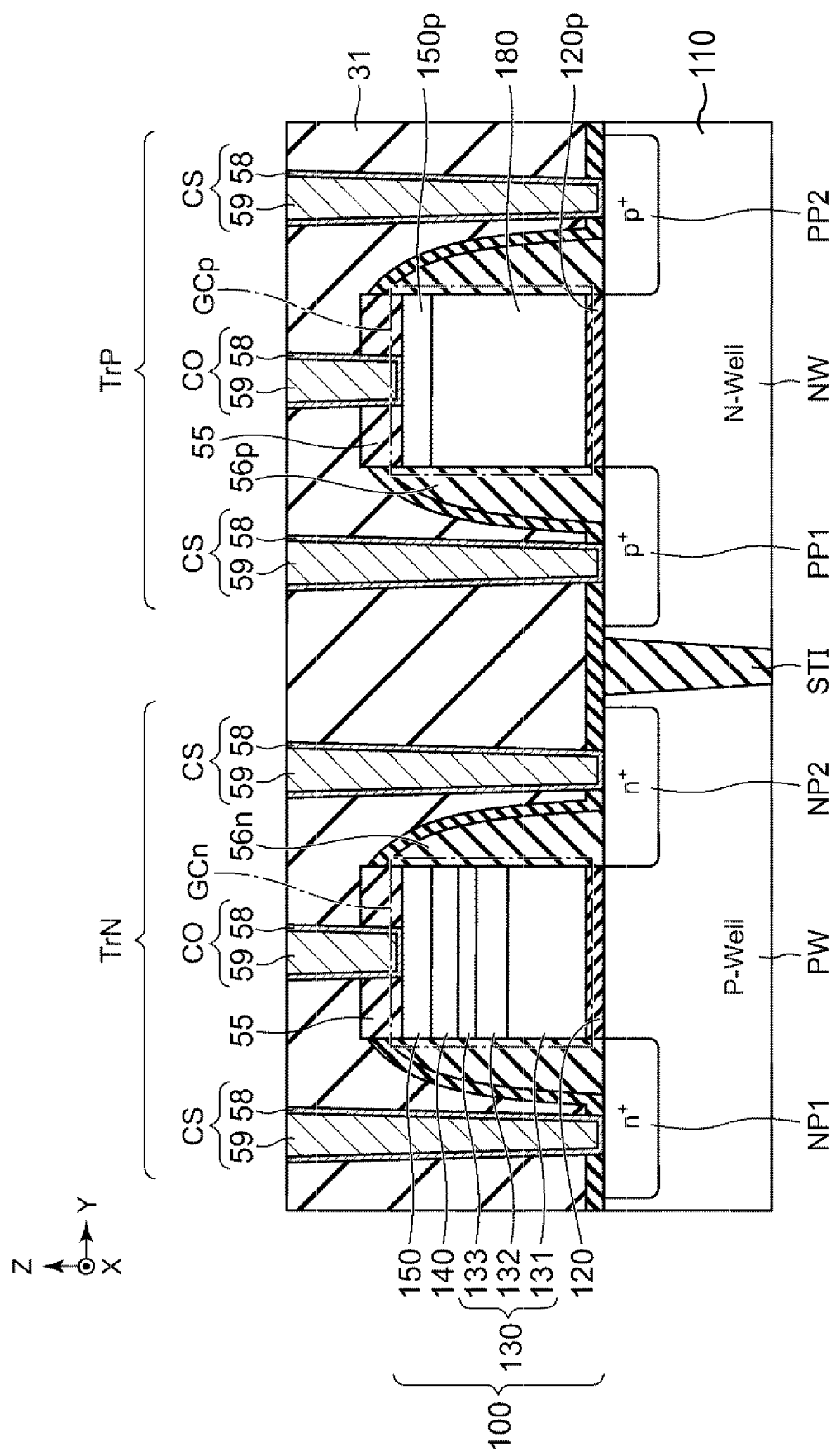
FIG. 4 is a cross-sectional view showing a complementary metal oxide semiconductor field effect transistor (CMOSFET) according to an embodiment.

A semiconductor device according to a second embodiment is a CMOSFET shown in FIG. 4. The CMOSFET shown in FIG. 4 includes an N-channel MOSFET (hereinafter, may be referred to as "NMOS transistor (TrN)"), and a P-channel MOSFET (hereinafter, may be referred to as "PMOS transistor (TrP)"). In FIG. 4, an X direction will be described as a gate width direction, a Y direction will be described as a gate length direction, and a Z direction will be described as a direction intersecting the X direction and the Y direction.

A P-type well region PW, an N-type well region NW, and an element isolation region STI (Shallow Trench Isolation) for electrically separating the N-type well region NW from the P-type well region PW are formed near the surface of the semiconductor substrate 110. For example, silicon oxide (SiO) is used for the element isolation region STI.

The NMOS transistor TrN is formed in the P-type well region PW, and the PMOS transistor TrP is formed in the N-type well region NW.

The gate electrode 100 described above is used as a gate electrode GCn of the NMOS transistor TrN. The upper surface of the metal layer 150 is covered with an insulating layer 55. The side surface of the metal layer 150 is covered with an insulating layer 56n. The insulating layer 56n functions as a sidewall of the gate electrode 100 of the NMOS transistor TrN. The insulating layer 55 has an opening so that a contact plug C0 is connected to the gate electrode 100 through the opening.

Further, the P-type well region PW includes $n^+$ impurity diffusion regions NP1 and NP2, and is doped with, for example, the phosphorus (P). The $n^+$ impurity diffusion region NP1 is disposed apart from the $n^+$ impurity diffusion region NP2 in the Y direction. The $n^+$ impurity diffusion regions NP1 and NP2 function as a source (or a source diffusion layer) and a drain (or a drain diffusion layer) of the NMOS transistor TrN. The $n^+$ impurity diffusion regions NP1 and NP2 are connected to respective contact plugs CS.

The contact plugs CS, C0 each includes a conductive layer 58 formed on a bottom surface and side surfaces of a contact hole, and a conductive layer 59 embedded in the contact hole so as to contact the conductive layer 58. The conductive layer 58 functions as a barrier metal, and is formed of a stacked structure of titanium (Ti) and titanium nitride (TiN). For example, tungsten (W) is used for the conductive layer 59.

The PMOS transistor TrP has a known, general structure. For example, near a surface of the N-type well region NW, $p^+$ impurity diffusion regions PP1 and PP2 are disposed apart from each other in the Y direction, and a gate insulation layer 120p of a gate electrode GCp is provided in a region therebetween. The $p^+$ impurity diffusion regions PP1 and PP2 are doped with, for example, boron (B). The $p^+$ impurity diffusion regions PP1 and PP2 function as a source (or a source diffusion layer) and a drain (or a drain diffusion layer) of the PMOS transistor TrP.

Further, a boron (B)-doped polysilicon layer 180 is provided between the gate insulation layer 120p and a metal layer 150p. The upper surface of the metal layer 150p is covered with the insulating layer 55. The side surface of the metal layer 150p is covered with an insulating layer 56p. The insulating layer 56p functions as a sidewall of the gate electrode GCp of the PMOS transistor TrP. The insulating layer 55 has an opening so that a contact plug C0 is connected to the gate electrode GCp through the opening. The $p^+$ impurity diffusion regions PP1 and PP2 are connected to respective contact plugs CS.

A conductor layer (not shown in FIG. 4, reference numeral DO in FIG. 10) is connected to the upper surfaces of the contact plugs CS and C0. This conductor layer functions as a wiring between the PMOS transistor TrP and the NMOS transistor TrN shown in FIG. 4 and another transistor or an external connection terminal.

The contact plug CS is a conductor layer provided between the source or the drain of the NMOS transistor TrN and the PMOS transistor TrP and the conductor layer. The contact plug C0 is a conductor layer provided between the gate electrode of the NMOS transistor TrN and the PMOS transistor TrP and the conductor layer. Each of the $n^+$ impurity diffusion regions NP1 and NP2 and the $p^+$ impurity diffusion regions PP1 and PP2 is electrically connected to the conductor layer via the contact plug CS. Further, the NMOS transistor TrN and the PMOS transistor TrP are covered with an insulating layer 31.

Figure 5A:
FIG. 5A to FIG. 5F are diagrams showing a manufacturing process of a CMOSFET according to an embodiment.
Figure 5B:
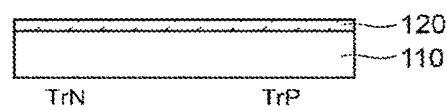

The CMOSFET described above is manufactured, for example, as follows. Hereinafter, a manufacturing process of the CMOSFET will be described with reference to FIGS. 5A-5F, 6A-6D, and 7A-7E. First, the semiconductor substrate 110 is prepared as shown in FIG. 5A, and the gate insulation layer 120 is formed on one surface of the semiconductor substrate 110 as shown in FIG. 5B. The P-type well region PW, the N-type well region NW, the n+ impurity diffusion regions NP1 and NP2, and the p+ impurity diffusion regions PP1 and PP2 are not shown in FIG. 4.

Figure 5C:
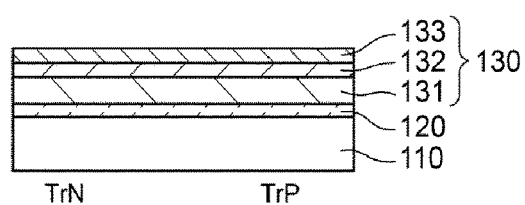
Figure 5D:
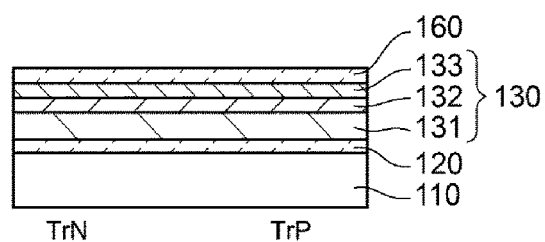

As shown in FIG. 5C, the first layer 131, the second layer 132, and the third layer 133 are formed on the gate insulation layer 120 in this order to form the stacked semiconductor layer 130. As shown in FIG. 5D, the oxide film 160 is formed on the third layer 133. The oxide film 160 is formed by, for example, thermal oxidation.

Figure 5E:
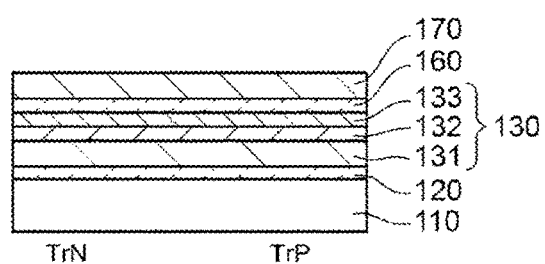
Figure 5F:
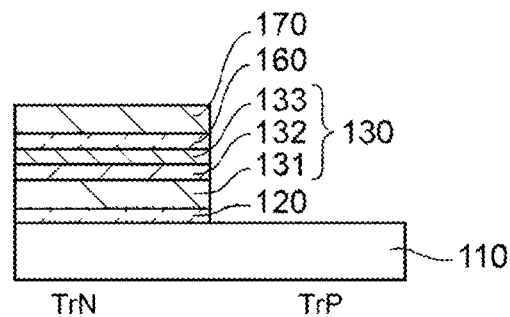

Next, as shown in FIG. 5E, a stopper layer 170 is formed. For example, the stopper layer 170 includes silicon nitride (SiN). As shown in FIG. 5F, a part of the stacked layers is removed to form the PMOS transistor TrP using a removing method such as RIE (Reactive Ion Etching).

Figure 6A:
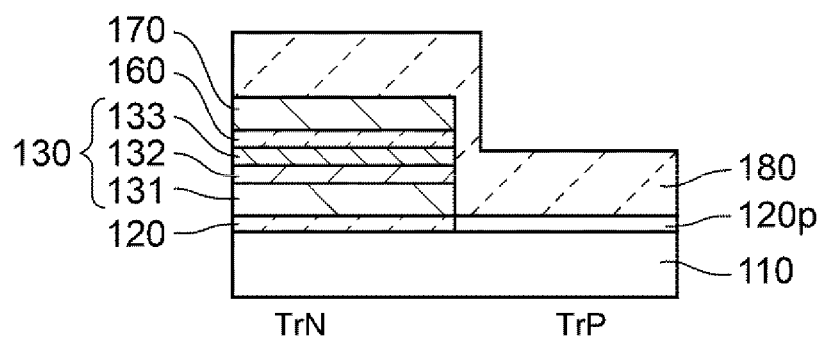
FIG. 6A to FIG. 6D are diagrams showing a manufacturing process of a CMOSFET according to an embodiment.
Figure 6B:
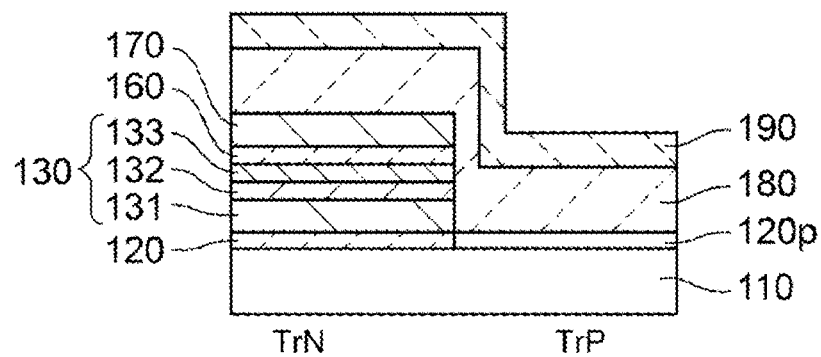

As shown in FIG. 6A, the gate insulation layer 120p of the PMOS transistor TrP is formed, and the boron (B)-doped polysilicon layer 180 is formed on the gate insulation layer 120p. The B-doped polysilicon layer 180 is not only formed on the gate insulation layer 120p on the side (referred to as the PMOS transistor TrP side) on which the PMOS transistor TrP is formed later, but also formed on the stopper layer 170 on the side (referred to as the NMOS transistor TrN side) on which the NMOS transistor TrN is provided later. As shown in FIG. 6B, a stopper layer 190 is formed on the B-doped polysilicon layer 180. For example, the stopper layer 190 includes SiN.

Figure 6C:
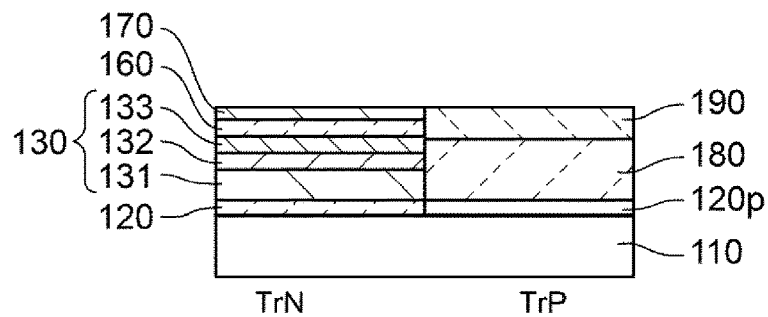
Figure 6D:
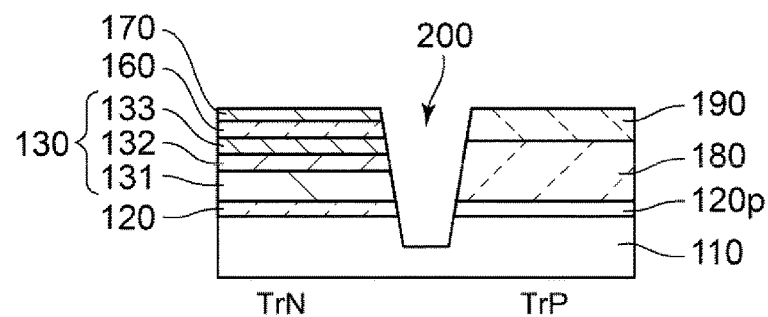

As shown in FIG. 6C, the B-doped polysilicon layer 180 on the side of the NMOS transistor TrN is removed by the RIE. As shown in FIG. 6D, an STI groove 200 that separates the NMOS transistor TrN from the PMOS transistor TrP is formed.

Figure 7A:
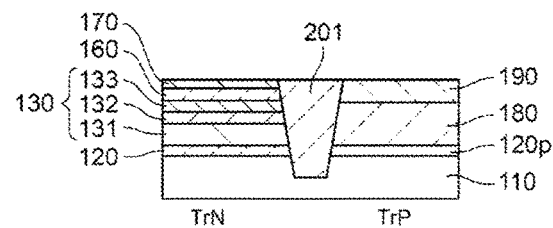
FIG. 7A to FIG. 7E are diagrams showing a manufacturing process of a CMOSFET according to an embodiment.
Figure 7B:
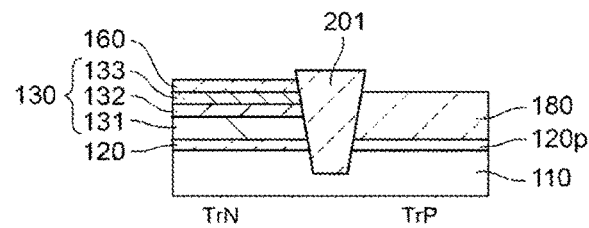

As shown in FIG. 7A, a filling 201 is filled into the STI groove 200. For example, the filling 201 is silicon oxide (SiO) material. The structure formed by filling 201 ultimately corresponds to an element isolation region STI. After the filling of the STI groove 200 with the filling 201, a part of the stopper layer 170, a part of the stopper layer 190, and a part of the filling 201 are removed using a removing method such as CMP. As shown in FIG. 7B, the stopper layer 170 on the side of the NMOS transistor TrN and the stopper layer 190 on the side of the PMOS transistor TrP are removed using a removing method such as wet etching.

Figure 7C:
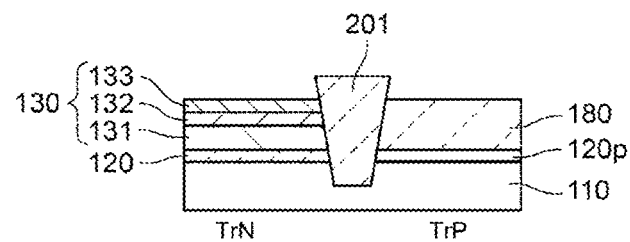
Figure 7D:
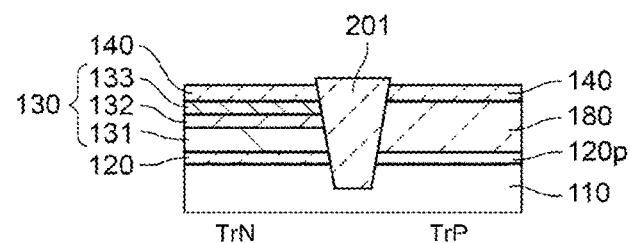
Figure 7E:
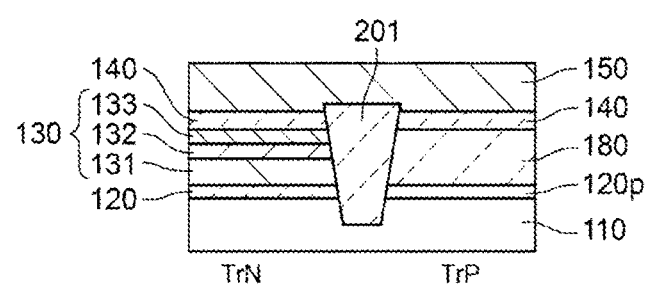

As shown in FIG. 7C, the oxide film 160 of the NMOS transistor TrN and the upper layer portion of the third layer 133 of the three-layer polycrystalline semiconductor layer 130 are removed using a removing method such as wet etching. As shown in FIG. 7D, the TSI layer 140 is formed on the third layer 133 on the side of the NMOS transistor TrN and on the B-doped polysilicon layer 180 on the side of the PMOS transistor TrP. As shown in FIG. 7E, the metal layer 150 is formed on the TSI layer 140.

Although not shown, the CMOSFET is manufactured with some additional processes necessary for forming the NMOS transistor TrN and the PMOS transistor TrP, such as a process for separating the metal layer 150 into two layers for the NMOS transistor TrN and the PMOS transistor TrP.

When the stopper (SiN) layer 170 is formed directly on the second layer 132 without forming the third layer 133 in the step of the manufacturing process shown in FIG. 5E, abnormal oxidation may occur at the interface between the second layer 132 and the stopper layer 170 when heat is applied in subsequent processes. This abnormal oxidation is considered to be caused by the phosphorus (P) doped in the first layer 131 being trapped by C contained in the second layer 132, and this produces the etching residue and the like during etching (the step in FIG. 7A) after the STI (filling 201) has been formed. This etching residue may cause an increase in a leakage current of the transistor. Further, the etching residue causes a short circuit between the gate electrodes 100 (GCn) and the like, which causes a decrease in a manufacturing yield.

Therefore, in the gate electrode 100 of the aforementioned embodiments, the third layer 133 having a phosphorus concentration lower than that of the first layer 131 is provided on the second layer 132. Since low-concentration P-doped or undoped polysilicon or the like is used for the third layer 133, segregation of the phosphorus in a thermal process can be prevented. Thus, generation of the etching residue can be prevented. As a result, occurrence of defects due to the etching residue can be prevented, and transistor performance can be improved. Further, by reducing the etching residue, a yield of the transistor can be increased.

Third Embodiment/Semiconductor Storage Device

The CMOSFET is used in, for example, a control circuit of a three-dimensional stacked non-volatile memory device in which memory cell transistors are three-dimensionally stacked on a semiconductor substrate. However, the application of the semiconductor device is not limited thereto, and the semiconductor device may be used for various semiconductor devices. A three-dimensional stacked NAND flash memory as the semiconductor storage device according to a third embodiment will be described with reference to FIGS. 8, 9, and 10.

Figure 8:
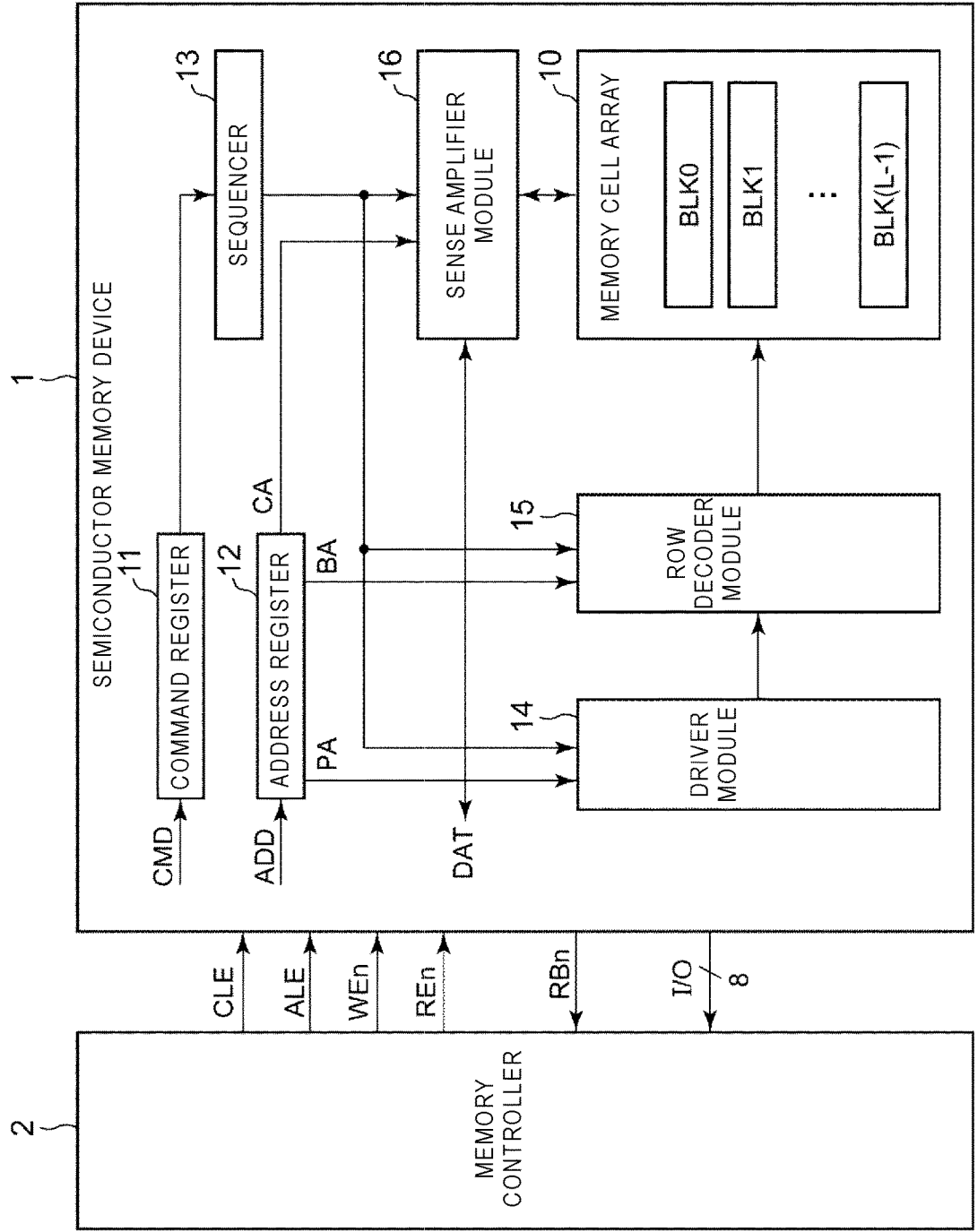
FIG. 8 is a block diagram of a semiconductor storage device according to an embodiment.

FIG. 8 is a block diagram showing the three-dimensional stacked NAND flash memory. As shown in FIG. 8, a semiconductor memory device 1 is controlled by, for example, an external memory controller 2. The semiconductor memory device 1 includes a memory cell array 10, a command register 11, an address register 12, a sequencer 13, a driver module 14, a row decoder module 15, and a sense amplifier module 16.

The memory cell array 10 includes a plurality of blocks BLK0 to BLK(L−1) where L is an integer of 2 or more. A block BLK includes a plurality of memory cell transistors (hereinafter, may be referred to as "memory cells") that store data non-volatilely, and is used, for example, as a data erasing unit. A plurality of bit lines and a plurality of word lines are provided in the memory cell array 10. Each memory cell transistor is associated with, for example, one bit line and one word line. A configuration of the memory cell array 10 will be described later in detail.

The command register 11 stores a command CMD received from the memory controller 2 by the semiconductor memory device 1. The command CMD includes instructions that cause the sequencer 13 to perform a read operation, a write operation, an erasing operation, and the like. The address register 12 stores address information ADD received from the memory controller 2 by the semiconductor memory device 1. The address information ADD includes a block address BA, a page address PA, and a column address CA. For example, the block address BA, the page address PA, and the column address CA are respectively used to select the block BLK, the word line, and the bit line.

The sequencer 13 controls an entire operation of the semiconductor memory device 1. For example, based on the command CMD stored in the command register 11, the sequencer 13 controls the driver module 14, the row decoder module 15, and the sense amplifier module 16 to perform the read operation, the write operation, the erasing operation, and the like.

The driver module 14 generates a voltage to be used in the read operation, the write operation, the erasing operation, and the like. Then, the driver module 14 applies the generated voltage to a signal line corresponding to the selected word line based on the page address PA stored in the address register 12.

The row decoder module 15 selects one corresponding block BLK in the memory cell array 10 based on the block address BA stored in the address register 12. Then, the row decoder module 15 applies to the selected word line in the selected block BLK, the voltage applied to the signal line corresponding to the selected word line.

In the write operation, the sense amplifier module 16 applies a desired voltage to each bit line according to write data DAT received from the memory controller 2. In the read operation, the sense amplifier module 16 identifies (reads) the data stored in a memory cell based on a voltage of a bit line, and transfers the read result to the memory controller 2 as read data DAT.

Communication between the semiconductor memory device 1 and the memory controller 2 is made by, for example, a NAND interface. For example, in the communication between the semiconductor memory device 1 and the memory controller 2, a command latch enable signal CLE, an address latch enable signal ALE, a write enable signal WEn, a read enable signal REn, a ready/busy signal RBn, and an input/output signal I/O are used.

The command latch enable signal CLE is a signal indicating that the input/output signal I/O received by the semiconductor memory device 1 is the command CMD. The address latch enable signal ALE is a signal indicating that the input/output signal I/O received by the semiconductor memory device 1 is the address information ADD. The write enable signal WEn is a signal that instructs the semiconductor memory device 1 to input the input/output signal I/O. The read enable signal REn is a signal that instructs the semiconductor memory device 1 to output the input/output signal I/O.

The ready/busy signal RBn is a signal that notifies the memory controller 2 of whether the semiconductor memory device 1 is in a ready state in which an instruction from the memory controller 2 can be received, or in a busy state in which such an instruction cannot be received.

The input/output signal I/O is, for example, an 8-bit wide signal, and may include the command CMD, the address information ADD, the data DAT, and the like.

The semiconductor memory device 1 and the memory controller 2 described above may be combined to form a single semiconductor device. Examples of such a semiconductor device include a memory card such as an SD card, a solid-state drive (SSD), and the like.

Figure 9:
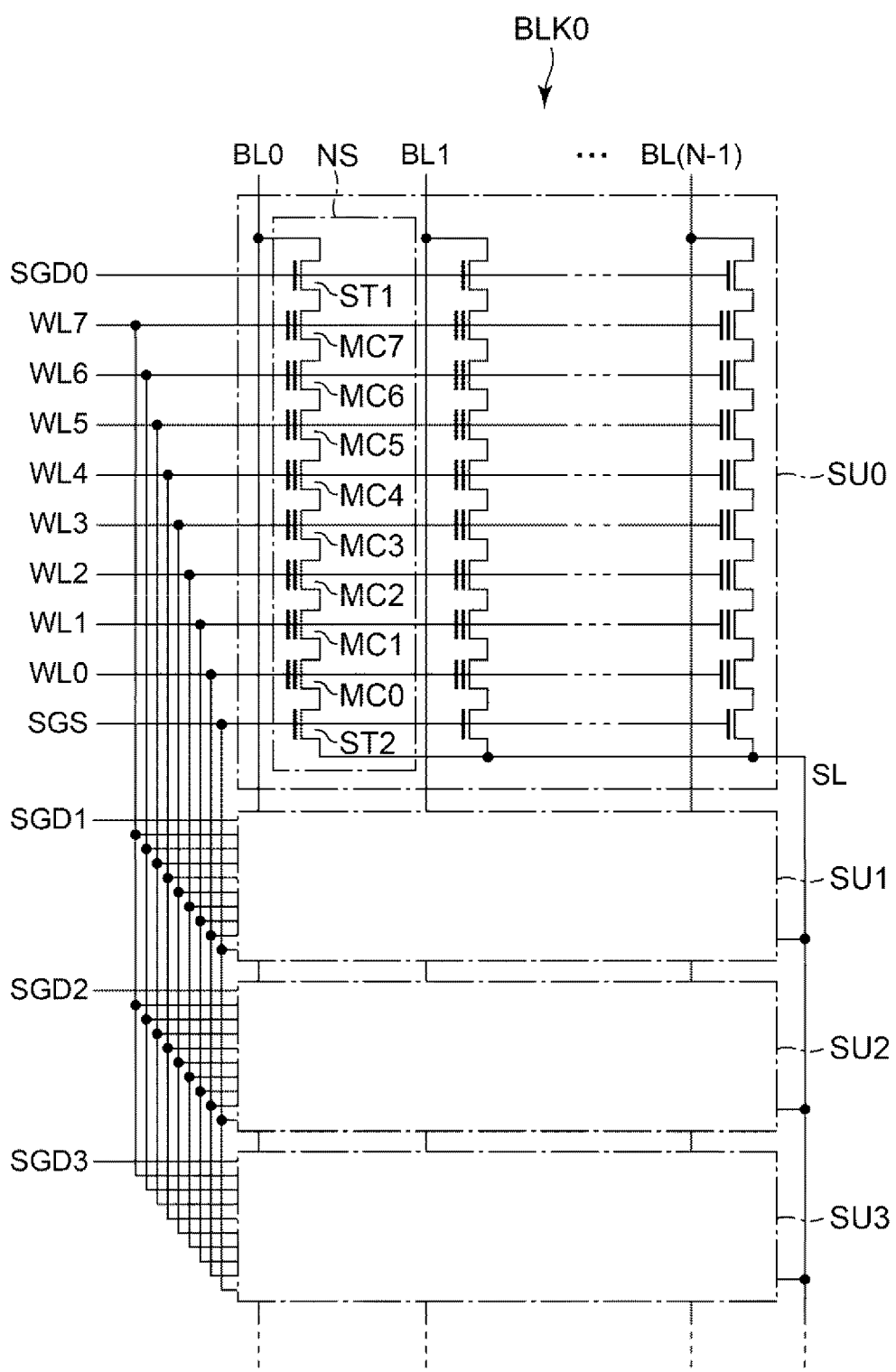
FIG. 9 is a schematic circuit diagram of a memory cell array of a semiconductor storage device according to an embodiment.

Next, a circuit configuration of the memory cell array 10 will be described with reference to FIG. 9. The example of FIG. 9 only shows the block BLK0 for illustration purpose. As shown in FIG. 9, the block BLK0 includes, for example, four string units SU0 to SU3. Each string unit SU includes a plurality of NAND strings NS.

The plurality of NAND strings NS are associated with bit lines BL0 to BL(N-1) where N is an integer of 2 or more. Each NAND string NS includes, for example, memory cell transistors MC0 to MC7, and select transistors ST1 and ST2.

The memory cell transistors MC include control gates and charge storage layers, and store data in a non-volatile manner. Hereinafter, when any one of the memory cell transistors MC0 to MC7 is not limited, the memory cell transistor is referred to as the memory cell transistor MC. The memory cell transistor MC may be a MONOS (Metal Oxide Nitride Oxide Semiconductor) type using an insulating film as the charge storage layer, and may be an FG (Floating Gate) type using the conductor layer as the charge storage layer. Hereinafter, the MONOS type will be described as an example.

The select transistor ST1 is used to select a string unit SU during various operations. In each NAND string NS, the drain of the select transistor ST1 is connected to an associated bit line BL. The source of the select transistor ST1 is connected to one end of the memory cell transistors MC0 to MC7 that are connected in series. The drain of the select transistor ST2 is connected to the other end of the memory cell transistors MC0 to MC7 that are connected in series.

In the same block BLK, the source of the select transistor ST2 is commonly connected to a source line SL. The gates of the select transistors ST1 in the string units SU0 to SU3 are connected to select gate lines SGDO to SGD3, respectively. The control gates of the memory cell transistors MC0 to MC7 are connected to word lines WL0 to WL7, respectively. The gates of the select transistors ST2 are commonly connected to a select gate line SGS.

In the circuit configuration of the memory cell array 10 described above, the plurality of NAND strings NS to which the same column address CA is assigned are commonly connected to the same bit line BL among the plurality of blocks BLK. The source line SL is commonly connected between the plurality of blocks BLK.

The circuit configuration of the memory cell array 10 provided in the semiconductor memory device 1 is not limited to the configuration described above. For example, the number of the memory cell transistors MC and the select transistors ST1 and ST2 in each NAND string NS may be different. Any number of the string units SU may be formed in each block BLK.

Figure 10:
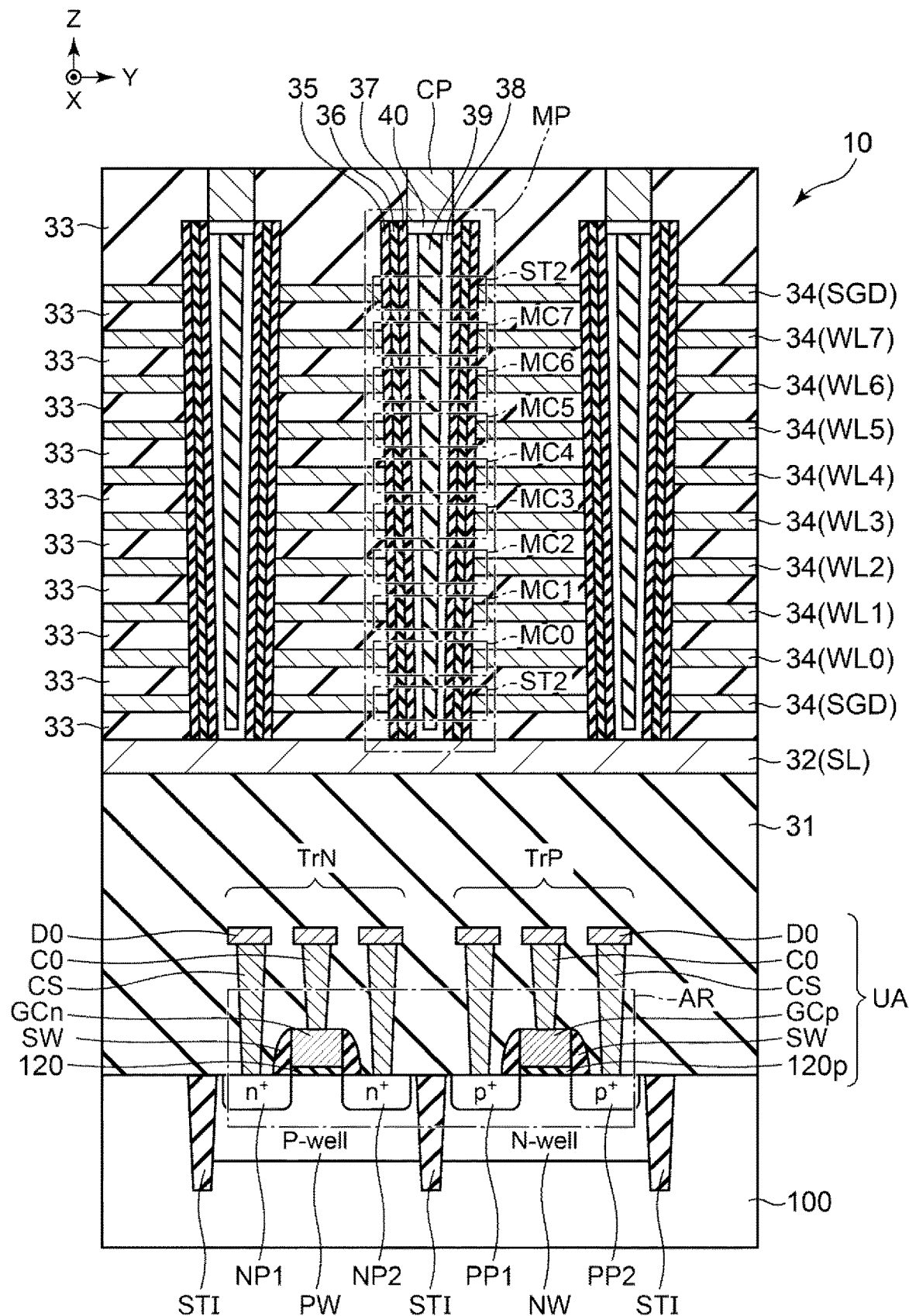
FIG. 10 is a cross-sectional view showing a semiconductor storage device according to an embodiment.

FIG. 10 shows a cross-sectional view of the memory cell array 10. As shown in FIG. 10, the insulating layer is formed on the semiconductor substrate 100. For example, the insulation layer 31 includes silicon oxide (SiO). A circuit region UA is provided in the insulating layer 31, and the memory cell array 10 is provided on or above the insulating layer 31. In the circuit region UA, for example, a circuit used for the sense amplifier module 16 or the like can be formed.

Next, a configuration of the memory cell array 10 will be described. A conductor layer 32 that functions as a source wire SL is provided on the insulating layer 31. For example, the conductor layer 32 is formed in a plate shape extending along an XY plane substantially parallel to the semiconductor substrate 100. The conductor layer 32 includes a conductive material such as a metal material or a semiconductor material.

On the conductor layer 32, an eleven-layer stack of insulating layers 33 and a ten-layer stack of conductor layers 34 are formed as an alternately film stack. For example, the insulating layers 33 include silicon oxide. The ten-layer conductor layers 34 individually function as, for example, the select gate line SGS, the word lines WL0 to WL7, and the select gate line SGD in this order from the bottom (portion nearest conductor 32) of the film stack. For example, the conductor layers 34 are formed in a plate shape extending along the X direction. The conductor layers 34 include a conductive material such as a metal material.

A plurality of memory pillars MPs that penetrate the ten conductor layers 34 and reach the conductor layer 32 are provided. The memory pillar MP is substantially perpendicular to the semiconductor substrate 100, and extends along the Z direction intersecting the X and Y directions. One memory pillar MP corresponds to one NAND string NS. The memory pillar MP includes a block insulating film 35, a charge storage layer 36, a tunnel insulating film 37, a semiconductor layer 38, a core layer 39, and a cap layer 40.

More specifically, a hole corresponding to the memory pillar MP is formed such that the memory pillar MP penetrates the ten conductor layers 34, and the bottom surface of the memory pillar MP contacts the conductor layer 32. The block insulating film 35, the charge storage layer 36, and the tunnel insulating film 37 are sequentially stacked on a side surface of the hole. Then, the semiconductor layer 38 is formed such that its side surface is in contact with the tunnel insulating film 37 and the bottom surface is in contact with the conductor layer 32. The semiconductor layer 38 is a region where channels of the memory cell transistors MC and the select transistors ST1 and ST2 are formed. Therefore, the semiconductor layer 38 functions as a signal line connecting current paths of the select transistor ST2, the memory cell transistors MC0 to MC7, and the select transistor ST1. The core layer 39 is provided in the semiconductor layer 38. The cap layer whose side surface is in contact with the tunnel insulating film 37 is formed on the semiconductor layer 38 and the core layer 39.

For example, silicon oxide is used for the block insulating film 35, the tunnel insulating film 37, and the core layer 39. For example, silicon nitride (SiN) is used for the charge storage layer 36. For example, polysilicon is used for the semiconductor layer 38 and the cap layer 40.

The memory pillar MP and the conductor layer 34 of which eight layers function as the word lines WL0 to WL7 respectively are combined to function as the memory cell transistors MC0 to MC7. Similarly, the memory pillar MP and the conductor layer 34 of which two layers function as the select gate lines SGD and SGS respectively are combined to function as the select transistors ST1 and ST2.

A contact plug CP is formed on the cap layer 40. A conductor layer (not shown) that functions as the bit line BL is formed on the contact plug CP. The contact plug CP includes a conductive material such as a metal material.

In the example of FIG. 10, three memory pillars MP are arranged along the Y direction, but the memory pillars MP may be arranged along a different direction.

The circuit region UA includes a semiconductor device including the above-described PMOS transistor TrP and the NMOS transistor TrN. As described above, the occurrence of the defects due to the etching residue can be prevented.

The PMOS transistor TrP and the NMOS transistor TrN may be used, for example, in the command register 11, the address register 12, the sequencer 13, the driver module 14, the row decoder module 15, the sense amplifier module 16, and the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
    a substrate;
    a gate insulating layer on the substrate;
    a stacked semiconductor layer including:
        a first layer formed on the gate insulating layer and including a phosphorus-doped polycrystalline semiconductor,
        a second layer formed on the first layer and including a carbon-doped polycrystalline semiconductor, and
        a third layer formed on the second layer and including a phosphorus-doped or undoped polycrystalline semiconductor; and
    a metal layer on or above the stacked semiconductor layer, wherein
    the third layer includes less phosphorus than the first layer or does not include phosphorus.

2. The semiconductor device according to claim 1, further comprising:
    an oxide layer between the third layer and the metal layer.

3. The semiconductor device according to claim 2, wherein the metal layer is a stacked body including a tungsten silicide layer and a titanium nitride layer that are stacked in this order from the stacked semiconductor layer.

4. The semiconductor device according to claim 1, wherein the metal layer is formed on the third layer and is a stacked body including a titanium layer, a titanium nitride layer, and a tungsten layer that are stacked in this order from the stacked semiconductor layer.

5. The semiconductor device according to claim 1, further comprising:
    an NMOS (N-type Metal Oxide Semiconductor) transistor and a PMOS (P-type Metal Oxide Semiconductor) transistor, wherein
    the substrate includes a P-type well region and an N-type well region,
    the NMOS transistor including the gate insulating layer, the stacked semiconductor layer, and the metal layer, is formed on the P-type well region, and
    the PMOS transistor is formed on the N-type well region.

6. The semiconductor device according to claim 5, wherein
    the P-type well region includes first and second N-type diffusion layers separated from each other along a surface of the substrate, and
    the gate insulating layer is formed on the surface between the first and second N-type diffusion layers.

7. The semiconductor device according to claim 5, wherein the substrate includes an isolation region that electrically separates the P-type well region from the N-type well region.

8. The semiconductor device according to claim 7, wherein a side surface of each of the gate insulating layer, the stacked semiconductor layer, and the metal layer, is covered by an insulating layer.

9. A memory device, comprising:
    one or more memory cell transistors; and
    a peripheral circuit configured to control the memory cell transistors and including an NMOS (N-type Metal Oxide Semiconductor) transistor comprising:
        a gate insulating layer formed on a substrate,
        a stacked semiconductor layer including:
            a first layer formed on the gate insulating layer and including a phosphorus doped polycrystalline semiconductor,
            a second layer formed on the first layer and including a carbon-doped polycrystalline semiconductor, and
            a third layer formed on the second layer and including a phosphorus-doped or undoped polycrystalline semiconductor, and a metal layer on or above the stacked semiconductor layer, wherein the third layer includes less phosphorus than the first layer or does not include phosphorus.

10. The memory device according to claim 9, wherein the peripheral circuit further includes a PMOS (P-type Metal Oxide Semiconductor) transistor, and
the substrate includes a P-type well region on which the NMOS (N-type Metal Oxide Semiconductor) transistor is formed, and an N-type well region on which the PMOS transistor is formed.

11. The memory device according to claim 10, wherein the P-type and N-type well regions are electrically separated from each other by an isolation region.

12. The memory device according to claim 11, wherein the NMOS and PMOS transistors are adjacent to each other across the isolation region.

13. The memory device according to claim 9, wherein
the P-type well region includes first and second N-type diffusion layers separated from each other along a surface of the substrate, and
the gate insulating layer is located on the surface between the first and second N-type diffusion layers.

14. The memory device according to claim 9, further comprising:
a wiring extending along a direction parallel to the substrate and electrically connected to one or more of the memory cell transistors, wherein
the NMOS and PMOS transistors are arranged along the first direction.

15. The memory device according to claim 9, further comprising:
a memory pillar extending along a direction in which the first, second, and third layers are stacked, and is used as a part of the memory cell transistors.

16. A method for forming a transistor on a substrate, the method comprising:
forming a gate insulating layer on the substrate;
forming a stacked semiconductor layer that includes:
a first layer including a phosphorus-doped polycrystalline semiconductor on the gate insulating layer,
a second layer including a carbon-doped polycrystalline semiconductor on the first layer, and
a third layer including a phosphorus-doped or undoped polycrystalline semiconductor on the second layer, wherein the third layer includes less phosphorus than the first layer or does not include phosphorus; and
forming a metal layer on or above the third layer.

17. The method according to claim 16, further comprising:
applying an oxide film to the third layer after the stacked semiconductor is formed but before the metal layer is formed;
forming a groove so as to penetrate the gate insulating layer, the stacked semiconductor layer, and the oxide film; and
removing the oxide film.

18. The method according to claim 17, wherein
the substrate includes a P-type well region and an N-type well region, and
the method further comprises:
after the oxide film is applied, removing all of the layers formed on or above the N-type well region; and
before the metal layer are formed, applying another gate insulating layer and a polysilicon layer on the N-type well region.

19. The method according to claim 16, wherein the metal layer is formed directly on the third layer and is a stacked body including a titanium layer, a titanium nitride layer, and a tungsten layer that are arranged in this order from the stacked semiconductor layer.

20. The method according to claim 16, further comprising:
forming an oxide layer on the third layer before the metal layer is formed, wherein
the metal layer has a stacked body including a tungsten silicide layer and a titanium nitride layer that are arranged in this order from the stacked semiconductor layer.

* * * * *